United States Patent
Abel et al.

(10) Patent No.: US 7,366,086 B2
(45) Date of Patent: Apr. 29, 2008

(54) CROSSTALK REDUCTION IN A BACKPLANE EMPLOYING LOW-SKEW CLOCK DISTRIBUTION

(75) Inventors: Christopher J. Abel, Coplay, PA (US); Joseph Anidjar, Asbury, NJ (US); James D. Chlipala, Emmaus, PA (US); Abhishek Duggal, Allentown, PA (US); Donald R. Laturell, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 855 days.

(21) Appl. No.: 10/780,945

(22) Filed: Feb. 18, 2004

(65) Prior Publication Data
US 2005/0088958 A1    Apr. 28, 2005

Related U.S. Application Data

(60) Provisional application No. 60/514,427, filed on Oct. 24, 2003.

(51) Int. Cl.
*H04J 1/12* (2006.01)

(52) U.S. Cl. ...................................... 370/201; 370/508
(58) Field of Classification Search ................ 370/201, 370/503, 508
See application file for complete search history.

(56) References Cited

U.S. PATENT DOCUMENTS

| 6,377,640 | B2 * | 4/2002 | Trans | 375/354 |
| 6,820,234 | B2 * | 11/2004 | Deas et al. | 714/814 |
| 2002/0181633 | A1 * | 12/2002 | Trans | 375/354 |

* cited by examiner

*Primary Examiner*—Chi Pham
*Assistant Examiner*—Phuc Tran
(74) *Attorney, Agent, or Firm*—Steve Mendelsohn; Kevin M. Drucker

(57) ABSTRACT

A system for a backplane that employs i) an adjustment of positive-to-negative (P-N) driver skew of a transmit signal of a relatively high-speed differential driver to reduce far-end crosstalk, ii) a high-speed differential subtraction circuit combining a gain-adjusted replica of at least one transmit signal with a received signal to reduce near-end crosstalk, and iii) a phase-locked loop (PLL) synchronization circuit to align timing events between a set of near-end and far-end high-speed interfaces.

12 Claims, 6 Drawing Sheets

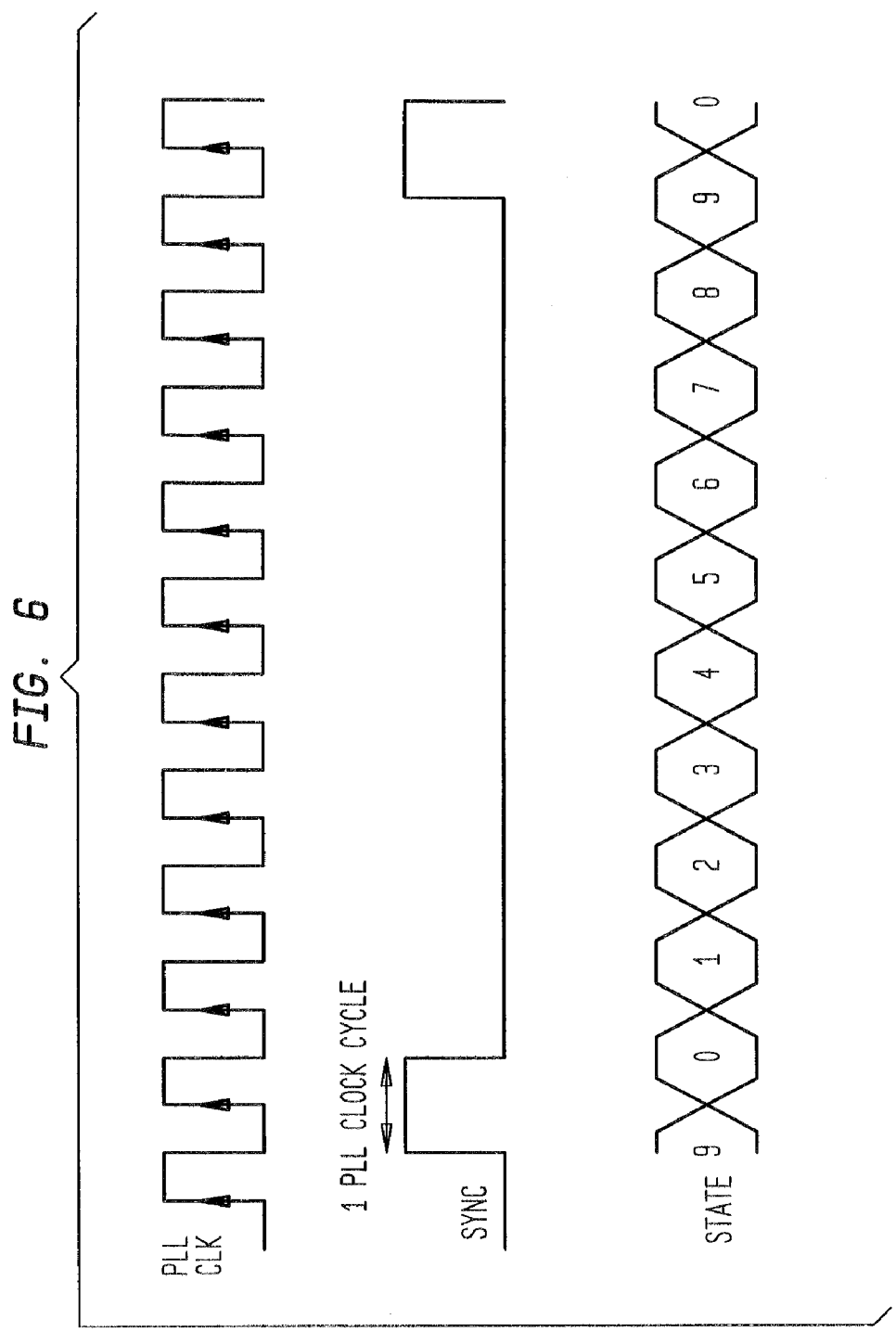

CROSSTALK REDUCTION IN A BACKPLANE EMPLOYING LOW-SKEW CLOCK DISTRIBUTION

CROSS-REFERENCE TO RELATED APPLICATIONS

This application claims the benefit of the filing date of U.S. provisional application No. 60/514,427, filed on Oct. 24, 2003.

BACKGROUND OF THE INVENTION

1. Field of the Invention

The present invention relates to transfer of signals through channels of a backplane, and, more specifically, to reduction of crosstalk between the channels.

2. Description of the Related Art

A terminal transferring signals in channels between circuit boards, a circuit board transferring signals in channels between circuit components, and an application specific integrated circuit (ASIC) transferring signals in channels between circuit modules are examples of typical communication applications. These communication applications may employ a backplane to couple the circuit boards/components/modules. For these communication applications, a backplane that has groups of transmit and receive channels may have the channels physically located very close to one another. For circuit board, hybrid device, and integrated circuit (IC) applications especially, as the speed of the transferred signals increases through the channels, electromagnetic effects degrade signal quality through introduced noise and background interference between the channels, sometimes referred to as "crosstalk."

FIG. 1 shows a backplane configuration 100 illustrating coupling of signals between channels. As shown in FIG. 1, channel 1 transfers signals between modules A and B (between CH1 A and CH1 B), and channel 2 transfers signals between modules A and B (between CH2 A and CH2 B). Each signal is a differential signal transferred over a differential pair, where one of the pair is designated a positive node or terminal and the other one of the pair is a negative node or terminal. A transmit portion of channel 1 (e.g., TX of CH1 A) transfers a first signal to a receive portion of channel 1 (e.g., RX of CH1 B). Similarly, a transmit portion of channel 2 (e.g., TX of CH2 B) transfers a second signal to a receive portion of channel 2 (e.g., RX of CH2 A). Coupling 105 occurs between the first and second signals of CH1 and CH2. The terms "near end" and "far end" for a module are well known in the art and may be understood with respect to FIG. 1. Module CH1 A has as its near end the TX and RX of CH1 A, while module CH1 A has as its far end the TX and RX of CH1 B.

Near-end crosstalk (NEXT) is distortion of the signal that occurs at the near-end (the receiver) of a module. Tests by EMC/EMI specialists in many disciplines indicate that the majority of NEXT that a given receiver experiences in a multiple channel (spatial) environment is due to adjacent channel coupling from the transmitter. Far-end crosstalk (FEXT) is distortion of the signal that occurs at the far end of the module. The majority of FEXT that a channel experiences is due to common-mode imbalance. That common-mode imbalance is directly related to positive-to-negative (P-N) skew (misalignment) between the signals in the differential pair of the module's transmit portion of the channel.

The placement of backplane traces (location of leads carrying the signals in the transmit and receive portion channels) between two channels in a given package (physical circuit/backplane implementation) relates to the observed crosstalk effects. Crosstalk is generally a significant factor in observed performance in tightly packed back planes (e.g., when there is <1-mm separation between differential pairs). This placement may cause i) coupling of signals in the two channels to occur and ii) P-N common-mode imbalance to occur. In addition, crosstalk effects might not limit package size, and package parasitic terms might limit effectiveness of crosstalk reduction circuits.

Individual channels that are not integrated into a multiple-channel (spatial) environment also require crosstalk reduction, but such crosstalk reduction focuses on precise control of timing events between channels. Such precise control is severely limited when attempting to create low skew (<20 ps) control loops between separately packaged interfaces. Due to the larger physical size of an individually packaged part, crosstalk control of the prior art might not provide noticeable improvements in background noise.

Distributing high-speed clock signals (>1GHz) is desirable for enhanced performance of either high-density or high-speed integrated circuits. However, latency in the various clock signals may yield differences in timing between events on a given system-on-chip (SOC) implementation. Differences in the timing of signals may contribute to crosstalk effects, especially when differential signals are employed. This contribution to crosstalk effects arises as follows. Differential signals, when one is inverted and combined with the other, tend to cancel out noise (from, for example, coupling). If a difference in timing between the differential signals exists, the combination is imperfect and the added noise is not completely canceled. Synchronization of timing events between high-speed interfaces may reduce crosstalk effects.

In many prior art SOC designs, large portions of the ASIC operate at relatively low speed (e.g., <1 GHz) while supporting an interface to off-chip resources at relatively high speed (e.g., >1 GHz). Ordinarily, a series of dividers (e.g., divide-by-N stages) might be employed to distribute a low-speed clock that is derived from a high-speed clock. This distribution of a low-speed clock enables the scheduling of events in various parts of the SOC ASIC. These events may then be collected in an orderly fashion and ultimately re-timed to the high-speed clock. As an example, a collection of high-speed multiplexer channels comprising a set of low-speed parallel inputs, a low-speed reference timing circuit, and a high-speed reference timing circuit might share common low-speed and high-speed reference clocks.

However, timing inaccuracy occurs between the dividers, which timing inaccuracy is a function of the depth of memory (i.e., number of flip-flops) of a divider circuit and propagation delay differences inherent in electrical wiring or transmission lines. The most significant source of error is the accrual of latency differences due to differences in the stored state of the divider circuit outside of the PLL feedback circuit. As system speeds and circuit density increases, these small latency differences may affect SOC ASIC performance.

An example of potential performance limitation is substrate noise. The timing latency differences between sections of the ASIC served by the low-speed distribution network might result in substrate noise that occurs with limited predictability. Thus, SOC events are timed with an unpredictability based on the state differences between the divider circuits. An SOC scheduler of a prior art system might be unable to predict when activity-induced substrate noise will begin and may be scheduling events that ultimately lead to i) excessive jitter of the ground potential and ii) system meta-stability.

SUMMARY OF THE INVENTION

The present invention relates to a backplane that employs i) an adjustment of positive-to-negative (P-N) driver skew of a transmit signal of a relatively high-speed differential driver to reduce far-end crosstalk, ii) a high-speed differential subtraction circuit combining a gain-adjusted replica of the transmit signal to a received signal to reduce near-end crosstalk, and iii) a phase-locked loop (PLL) synchronization circuit to align timing events between a set of near-end and far-end high-speed interfaces.

In accordance with one embodiment of the present invention, signals in one or more transmit paths and one or more receive paths of a backplane are adjusted by: (a) adjusting a skew of a driver of a signal of a first path so as to compensate for far-end crosstalk effects in the first path; (b) generating an adjusted replica of the signal in the first path; and (c) combining the adjusted replica of the signal in the first path with a signal of a second path so as to compensate for near-end crosstalk effects in the second path. A relatively low-speed clock signal is generated, and timing events of a relatively high-speed clock signal are aligned, based on the low speed-clock signal, so as to coordinate events in the first and second paths between the near end and the far end.

BRIEF DESCRIPTION OF THE DRAWINGS

Other aspects, features, and advantages of the present invention will become more fully apparent from the following detailed description, the appended claims, and the accompanying drawings in which:

FIG. 6 shows a timing diagram illustrating a relationship of signals for the low-speed clock generator of FIG. 4.

DETAILED DESCRIPTION

Figure 1:
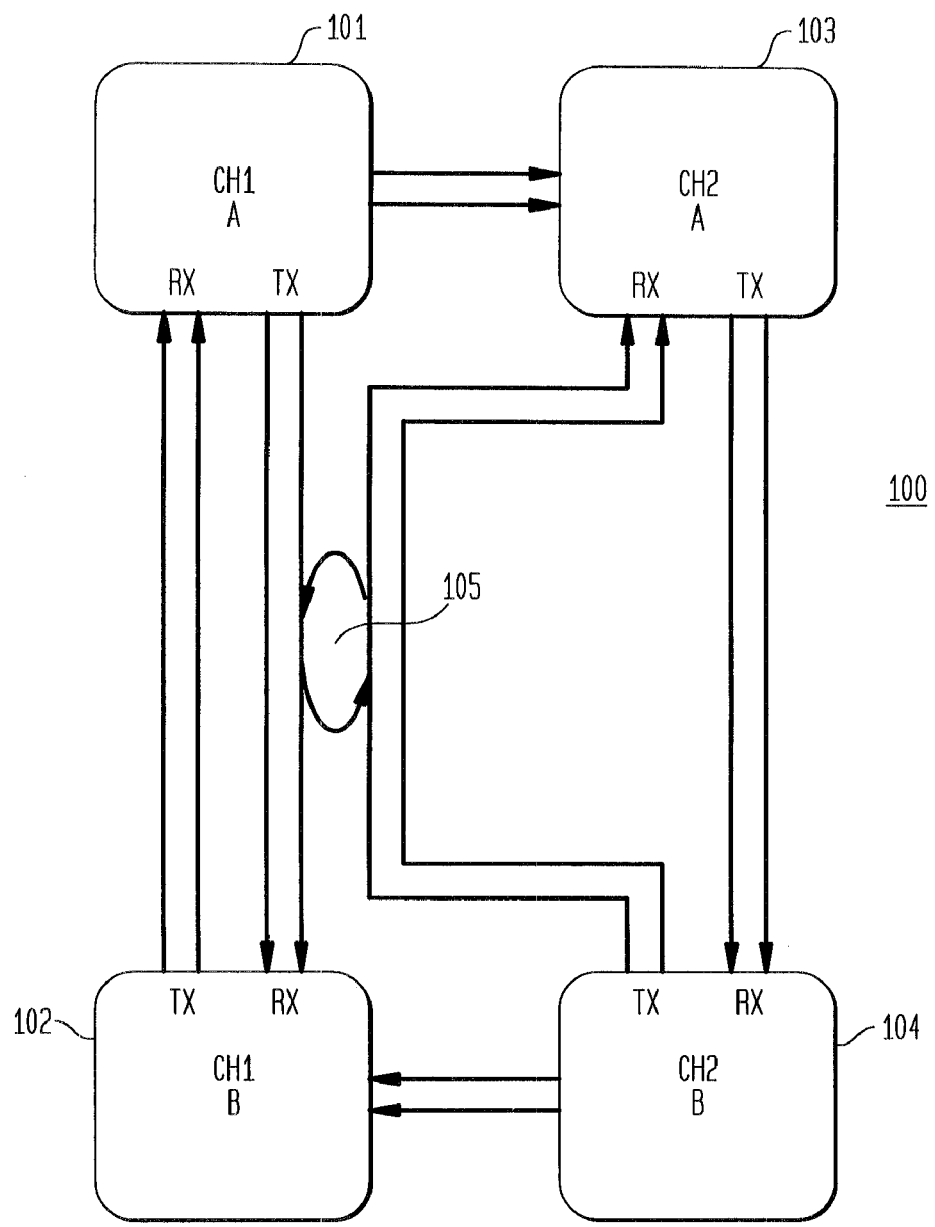
FIG. 1 shows a block diagram of a prior art backplane configuration illustrating coupling of signals from a transmit portion to a receive portion of a channel.
Figure 2:
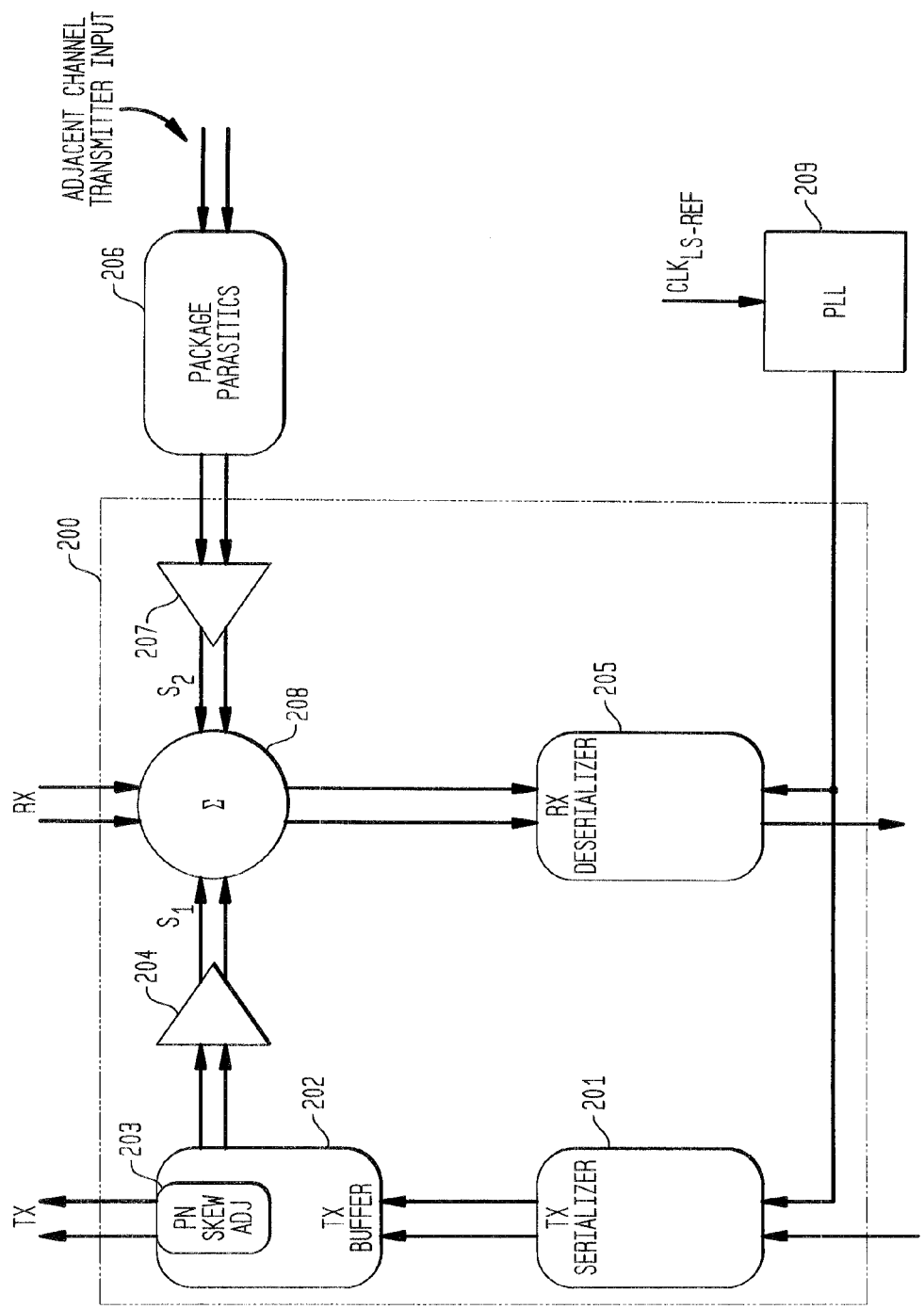
FIG. 2 shows a block diagram of a channel employing crosstalk reduction in accordance with an exemplary embodiment of the present invention.

FIG. 2 shows a channel unit 200 employing crosstalk reduction in accordance with an exemplary embodiment of the present invention. In the transmit portion, channel unit 200 comprises transmit (TX) serializer 201, TX buffer 202 including positive-to-negative skew adjuster (PN skew adj) 203, and gain adjuster 204. In the receive portion, channel unit 200 comprises combiner 208, receive (RX) deserializer 205, and gain adjuster 207. Gain adjusters 204 and 207 may be implemented with amplifiers. Channel unit 200 is coupled to phase-locked loop (PLL) 209 and may receive signals from an adjacent channel transmitter. Signals from the adjacent channel transmitter may be modified when passing through the impedance of the backplane or similar structure (shown as package parasitics 206).

Transmit portion (TX) of channel unit 200 may be coupled to a receiver of a far-end channel unit, while receive portion (RX) of channel unit 200 may be coupled to a transmitter of the far-end channel unit. As used herein, the term near-end crosstalk (NEXT) refers to distortion of the signal seen at RX of channel unit 200, and the term far-end crosstalk (FEXT) refers to distortion of the signal at the receiver (e.g., RX) of the far-end channel unit.

In the transmit portion, data is applied to TX serializer 201 which generates a differential, serial data stream timed via a clock signal from PLL 209. The lock signal from PLL 209 may typically be a high-speed system clock signal (e.g., with a frequency $\geq 2.5$ GHz) that is generated in accordance with a low-speed clock reference $CLK_{LS-REF}$. The differential, serial data stream from TX serializer 201 is applied to TX buffer 202, which buffers the differential, serial data stream prior to transmission as differential signals in the transmit portion TX of the channel. PN skew adj 203 of TX buffer 202 adjusts the positive-to-negative (P-N) skew of the differential signals in the transmit portion TX to cancel FEXT crosstalk effects.

PN skew adj 203 may include circuitry to detect imperfect balance in the differential signal pair. Coupling between trace pairs occurs due to imperfect balance in the differential pair, and so infinite common mode rejection is not present. Imperfect balance might be P-N skew, a difference in load from P to N, impedance differences between a P and an N termination, or other effects known in the art.

In the receive portion of the channel, input differential signals are applied to combiner 208, which may be implemented with, for example, a differential subtraction circuit. Gain adjuster 204 receives a replica of the transmitted signal from TX buffer 202 and adjusts the differential gain of the replica so as to match the level of the distortion (the coupled portion of transmit signal) when coupling between the TX and RX portions occurs. Gain adjuster 207 receives a signal from an adjacent channel that may be modified when passing through the impedance of package parasitics 206, and adjusts the differential gain of the signals so as to match the level of distortion when coupling between the adjacent channel and RX portion occurs.

The outputs $s_1$ and $s_2$ of gain adjusters 204 and 207 are applied to combiner 208 and added out of phase to the received differential signal to cancel NEXT crosstalk effects. Combiner 208 generates a serial, differential data steam that is then applied to RX deserializer 205. RX deserializer 205 generates a receive data stream from the serial, differential data steam of combiner 208. RX deserializer 205 generates the receive data stream in accordance with the clock signal from PLL 209.

As shown in the FIG. 2, a P-N skew adjustment circuit (e.g., PN skew adj 203) and gain adjustment amplifier(s) (e.g., gain adjusters 204 and 207) are employed to reduce crosstalk in the transmit (FEXT) and receive (NEXT) paths, respectively. Crosstalk reduction adjustment may be implemented as an iterative process and might occur as follows. First, the differential gain of each adjacent transmitter input $s_1$ and $s_2$ to the receiver analog subtraction circuit is adjusted by, for example, gain adjusters 204 and 207, to reduce NEXT. Second, the P-N skew of each transmitter is adjusted by, for example, PN skew adj 203, to reduce FEXT. Third, the signals of the transmit and receive portions are observed to detect crosstalk effects after the NEXT and FEXT adjustments. These three operations are then repeated to iteratively optimize crosstalk reduction.

Figure 3:
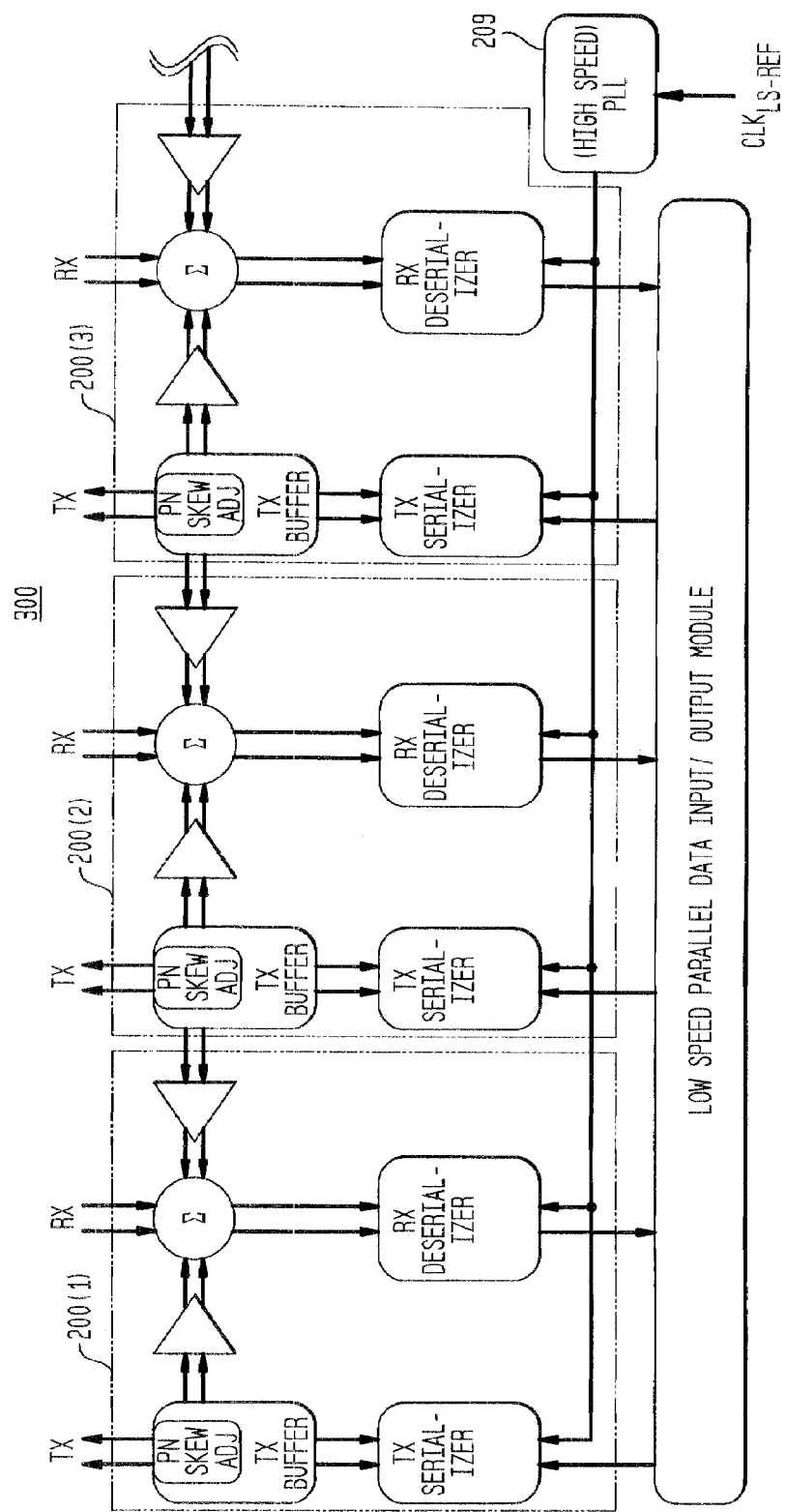
FIG. 3 shows a block diagram of an integrated multiple-channel, high-speed interface block with near-end and far-end crosstalk cancellation.

Channel unit 200 operates so as to cancel NEXT and FEXT crosstalk, and may be considered a basic building block of a high-speed interface with a backplane. FIG. 3 depicts an integrated multiple-channel high-speed interface block 300 with NEXT and FEXT crosstalk cancellation operating in accordance with an exemplary embodiment of the present invention. A series of three channel units 200(1), 200(2), and 200(3) are arranged in parallel, each receiving corresponding data from low-speed parallel data input/output (I/O) module 302. Each of channel units 200(1), 200(2), and 200(3) is commonly timed by the (high-speed) clock signal of PLL 209. As shown in FIG. 3, for a given channel unit, an adjacent transmit portion provides a correction signal into the analog subtraction circuit for NEXT crosstalk cancellation. Each transmit portion includes individual P-N skew adjustment for FEXT crosstalk cancellation. The configuration of FIG. 3 may be suited for dense backplane trace routing.

Figure 4:
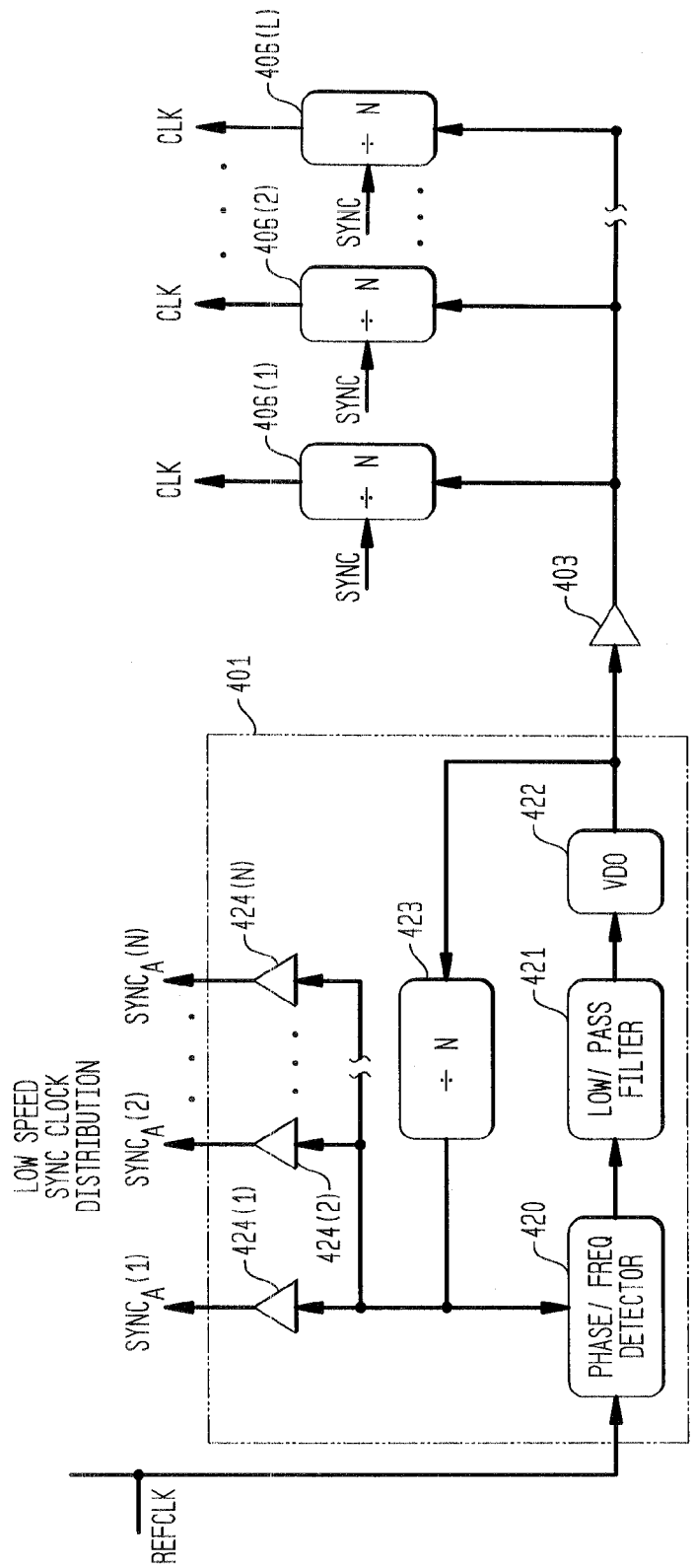
FIG. 4 shows a block diagram of a low-speed clock generator to provide a synchronous low-speed clock signal.

In addition to NEXT and FEXT crosstalk cancellation, the timing of events between high-speed interface blocks may be synchronized to further reduce crosstalk effects. Reduction of crosstalk may be enabled through use of low skew-rate clock signals. Distributing relatively high-speed clocks (e.g., >1 GHz) is desirable for enhanced performance of either high-density or high-speed integrated circuits. The present invention employs synchronizing circuitry directly related to the feedback loop of a high-speed PLL to synchronize events timed by a low-speed clock distribution system. FIG. 4 shows an exemplary low-speed reference clock generator 400 to provide a synchronous low-speed clock signal CLK that reduces timing uncertainty (such as, e.g., $CLK_{LS\text{-}REF}$).

Figure 5:
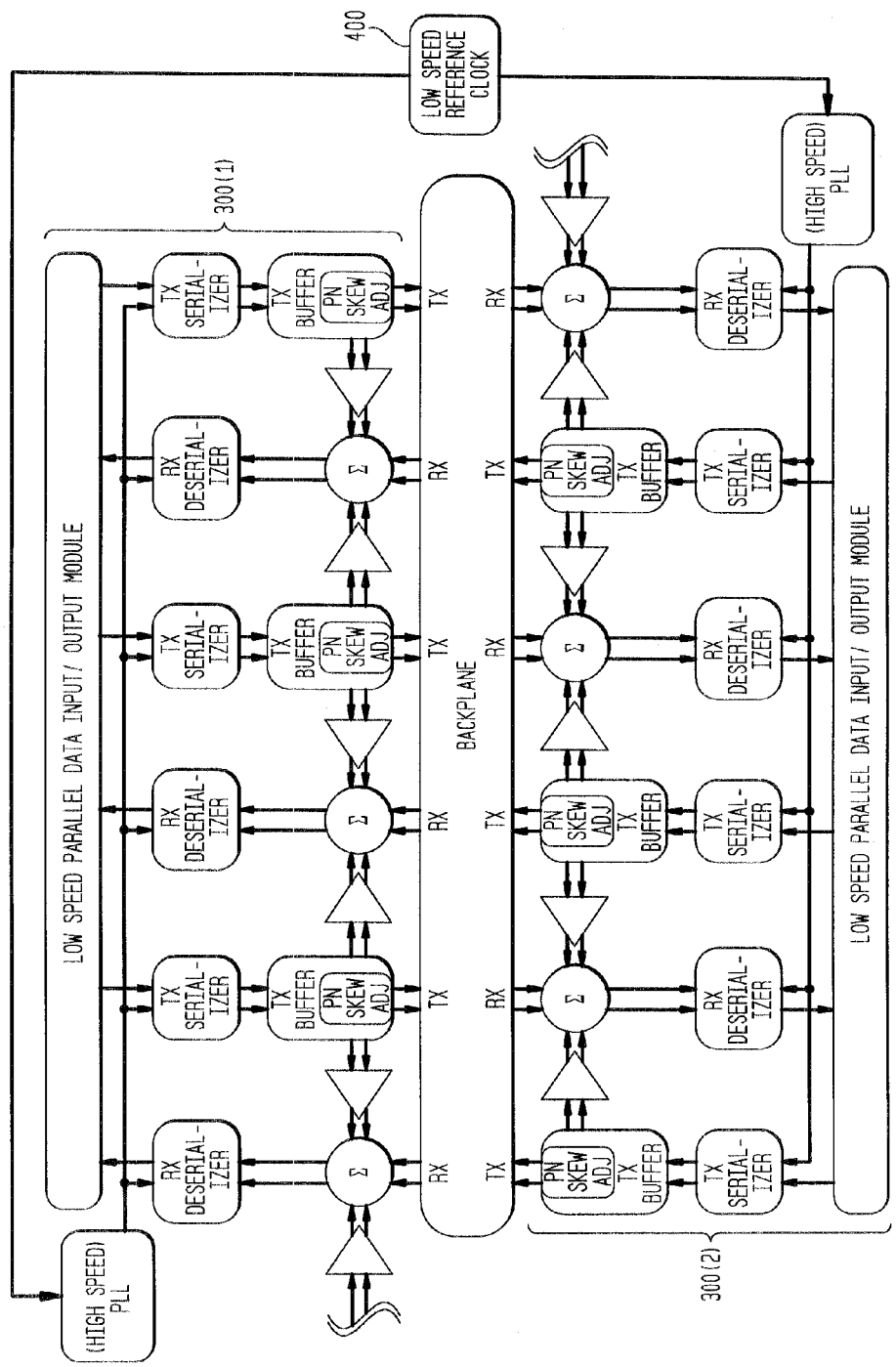
FIG. 5 shows a block diagram of an integrated multiple channel high-speed interface block with near-end and far-end crosstalk cancellation incorporating the low-speed clock generator of FIG. 4.

The exemplary low-speed reference clock generator 400 of FIG. 4 may be employed to time both the near and far ends of channel units. FIG. 5 shows an integrated multiple-channel high-speed interface block with near-end and far-end crosstalk cancellation incorporating a clock distribution system to provide a synchronous low-speed clock signal. As shown in FIG. 5, first integrated multiple-channel high-speed interface block 300(1) is coupled through backplane 502 to second integrated multiple-channel high-speed interface block 300(2). First and second integrated multiple-channel high-speed interface blocks 300(1) and 300(2) have their (high-speed) PLLs 209(1) and 209(2) timed by low-speed reference clock $CLK_{LS\text{-}REF}$ provided from low-speed reference clock generator 400. For a given implementation of FIG. 5, portions of, for example, an application-specific integrated circuit (ASIC) operate at relatively low speed (e.g., <1 GHz) while supporting an interface to off-chip resources at relatively high speed (e.g., >1 GHz). A set of dividers (e.g., divide-by-N stages) is employed to distribute the low-speed reference clock $CLK_{LS\text{-}REF}$, derived from a high-speed clock, to each of the PLLs 209(1) and 209(2).

Returning to FIG. 4, low-speed reference clock generator 400 comprises PLL 401, amplifier 403, and dividers 406(1) through 406(L), L a positive integer. PLL 401 comprises phase/frequency detector 420, low-pass filter 421, voltage-controlled oscillator (VCO) 422, and feedback divider 423. Operation of PLLs is well known in the art, and VCO 422 generates a high-speed clock signal whose output frequency is locked to the frequency of an input reference signal REFCLK by operation of PLL 401. The output of VCO 422 is divided by N, N a positive number, by feedback divider 423, and the output of feedback divider 423 is compared to REFCLK by phase/frequency detector 420. Phase/frequency detector 420 generates an error signal representing the phase/frequency difference between its input signals. The error signal from phase/frequency detector 420 is then applied to low-pass filter 421, which generates a control voltage for VCO 422. Amplifier 403 may represent one or more amplifiers employed to amplify and distribute the high-speed clock signal from VCO 422.

The high-speed clock signal, after division by N by feedback divider 423, is also employed to generate one or more synchronization signals SYNC(1) through SYNC(M), M a positive integer. Each of the synchronization signals SYNC(1) through SYNC(M) may be amplified prior to distribution through the IC with corresponding amplifiers 424(1) through 424(M). The one or more synchronization (SYNC) signals are distributed through the chip to dividers 406(1) through 406(L). Each of dividers 406(1) through 406(L) is generally a series of memory units arranged in a divider configuration. Each of dividers 406(1) through 406(L) is then synchronized with other dividers using the SYNC signal. Dividers 406(1) through 406(L) are shown in FIG. 4 as divide-by-N dividers, but the present invention is not so limited. The divider may employ any of the synchronization signals SYNC(1) through SYNC(M) for the SYNC signal, and such selection may be determined for a given implementation.

The SYNC signal is a pulse used as a reset signal for each of dividers 406(1) through 406(L). The memory elements in each divider receive this common SYNC pulse, which forces the memory elements to align themselves to a predetermined state at the instant that the SYNC pulse overlaps in time with an edge of the high-speed clock signal. This predetermined state is preferably the same for every divider. Since the SYNC signal pulse and high-speed clock signal pulse are common to every divider, each channel's memory elements remain aligned until, for example, a soft error or other timing instability event occurs. The timing relationship of the SYNC pulse and high-speed reference clock pulses (or PLL clock) with respect to valid event states is shown in FIG. 6.

The SYNC waveform may consist of a single pulse that occurs once during a count, which initializes counters and divider circuits in all channels to an initial state at the same instant of time. Alternatively, the SYNC waveform may be periodic; thereby initializing the counters and divider circuits on a regular interval and eliminating skew between state machines that may accumulate due to soft errors.

Low-speed reference clock generator 400 of FIG. 4 significantly reduces or eliminates timing skew for each divider in the collection of dividers that share the same low-speed reference clock, high-speed reference clock, and SYNC pulse circuits. The exemplary clock distribution system of FIG. 4 allows an SOC designer to model substrate noise more accurately, and allows the designer to more accurately determine when to launch SOC activities, thereby gaining at least some immunity to substrate noise. Thus, the events on an IC may be considered to be a function of propagation delay. The designer might model the propagation delay and schedule events on one side of the ASIC to take place before substrate noise on the other side of the ASIC has a chance to reduce signal-to-noise ratio (SNR) margins, resulting in higher-speed and higher-density SOC ICs. One uncertainty in timing for the circuit configuration of FIG. 4 is propagation delay differences due to physical separation of components of the SOC circuit, but this uncertainty in timing is relatively predictable in a given design implementation.

The configuration of low-speed reference clock generator 400 of FIG. 4 allows for flexibility of high- and low-speed clock distribution. For example, the output of each divider may be employed as a reference clock for a PLL that generates the timing for a channel unit, or the PLL of the low-speed reference generator may be the PLL that generates the timing for a channel unit.

A system employing one or more embodiments of the present invention may have substantially improved detection performance for transfer of data through high-speed interfaces in a backplane. In addition, the present invention may allow for a reduction in timing errors between GHz-rate multiplexer channels, synchronous timing of PLL clocks with multiple PLL circuits, and enhanced performance of SOC clock distribution. Enhanced performance of SOC clock distribution may provide for simplification of event scheduling, increased circuit component density in an integrated circuit, and reduce the cost of a given implementation of ultra-high-speed state machines in an SOC ASIC.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. An apparatus for compensating for crosstalk in paths of a backplane, the apparatus comprising:
   a first adjuster, coupled to a first path, adapted to adjust a skew of a driver of the first path so as to compensate for crosstalk effects in the first path;
   a second adjuster, coupled to the first adjustor, adapted to generate an adjusted replica of the signal in the first path;
   a combiner, coupled to the second adjustor, adapted to combine the adjusted replica with a signal of a second path so as to compensate for crosstalk effects in the second path from the signal in the first path; and
   a clock synchronization generator adapted to generate a relatively low-speed clock signal,
   wherein the relatively low-speed clock signal aligns timing events of a relatively high-speed clock signal that coordinate events in the first and second paths.

2. The invention as recited in claim 1, further comprising:
   a third adjuster, coupled to an adjacent channel and the combiner, adapted to generate an adjusted replica of a signal in the adjacent channel, and
   wherein the combiner is further adapted to combine the adjusted replica of the signal of the adjacent channel with the signal of the second path so as to compensate for the crosstalk effects in the second path from the signal of the adjacent channel.

3. The invention as recited in claim 1, wherein the signal of the first path is a differential signal, the driver is a differential driver, and the first adjuster is adapted to adjust the positive-to-negative skew of the differential driver.

4. The invention as recited in claim 3, wherein the signal of the second path is a differential signal, and the combiner is a differential subtraction circuit.

5. The invention as recited in claim 1, wherein the clock synchronization generator comprises:
   a phase-locked loop (PLL) adapted to generate a high-speed clock signal and a sync signal based on the high speed clock; and
   at least one divider, each divider adapted to divide the high-speed clock signal into the low-speed clock signal, and wherein each divider is synchronized to each other divider based on the sync signal.

6. The invention as recited in claim 5, wherein the phase-locked loop (PLL) comprises:
   an oscillator generating the high-speed clock signal based on a control signal;
   a feedback divider dividing the high-speed clock signal into a feedback signal, the sync signal based on the feedback signal; and
   a detector adapted to compare the feedback signal with a reference clock, the control signal based on the comparison of the feedback signal and reference clock.

7. The invention as recited in claim 1, the apparatus is embodied in a circuit.

8. The invention as recited in claim 7, wherein the circuit is an integrated circuit.

9. A method of adjusting signals in one or more transmit paths and one or more receive paths of a backplane, the method comprising the steps of:
   (a) adjusting a skew of a driver of a signal of a first path so as to compensate for far-end crosstalk effects in the first path;
   (b) generating an adjusted replica of the signal in the first path;
   (c) combining the adjusted replica of the signal in the first path with a signal of a second path so as to compensate for near-end crosstalk effects in the second path;
   (d) generating a relatively low-speed clock signal; and
   (e) aligning, based on the low speed-clock signal, timing events of a relatively high-speed clock signal coordinating events in the first and second paths between the near end and the far end.

10. The invention as recited in claim 9, further comprising the step of repeating steps (a) through (c) so as to iteratively adjust the near- and far-end crosstalk.

11. The invention as recited in claim 9, further comprising:
   (f) generating an adjusted replica of a signal in the adjacent channel, and
   (g) combining the adjusted replica of the signal of the adjacent channel with the signal of the second path so as to compensate for the crosstalk effects in the second path from the signal of the adjacent channel.

12. The invention as recited in claim 11, further comprising the step of repeating steps (a), (b), (c), (f), and (g) so as to iteratively adjust the signal of the second path.

* * * * *